(12) United States Patent
Shen et al.

(10) Patent No.: US 10,403,532 B2
(45) Date of Patent: Sep. 3, 2019

(54) SEMICONDUCTOR APPARATUS WITH INNER WAFER CARRIER BUFFER AND METHOD

(71) Applicant: TAIWAN SEMICONDUCTOR MANUFACTURING COMPANY, LTD., Hsin-Chu (TW)

(72) Inventors: Jason Shen, Jhubei (TW); Wen-Yu Huang, Zhubei (TW); Li-Jen Ko, Zhubei (TW); Hsiang Yin Shen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 983 days.

(21) Appl. No.: 13/623,814

(22) Filed: Sep. 20, 2012

(65) Prior Publication Data

US 2014/0075774 A1    Mar. 20, 2014

(51) Int. Cl.
*H01L 21/67* (2006.01)
*H01L 21/677* (2006.01)

(52) U.S. Cl.
CPC .. *H01L 21/67763* (2013.01); *H01L 21/67017* (2013.01); *H01L 21/67028* (2013.01); *H01L 21/67201* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,121,705 | A | * | 6/1992 | Sugino .............. H01L 21/67757 118/719 |
| 5,855,681 | A | * | 1/1999 | Maydan ............ H01L 21/67167 118/719 |
| 8,703,614 | B2 | | 4/2014 | Jin |
| 2003/0009904 | A1 | * | 1/2003 | Tokunaga ......... H01L 21/67017 34/406 |
| 2003/0113188 | A1 | * | 6/2003 | Pool .................. H01L 21/67778 414/217 |

FOREIGN PATENT DOCUMENTS

TW     200741804     11/2007
TW     201027659     7/2010

* cited by examiner

*Primary Examiner* — Karla A Moore
(74) *Attorney, Agent, or Firm* — Haynes and Boone, LLP

(57) ABSTRACT

The present disclosure provides one embodiment of a semiconductor processing apparatus. The semiconductor processing apparatus includes a load lock designed to receive a wafer carrier; an inner wafer carrier buffer configured to hold the wafer carrier received from the load lock and to perform a nitrogen purge to the wafer carrier; and a processing module designed to perform a semiconductor process to wafers from the wafer.

20 Claims, 6 Drawing Sheets

SEMICONDUCTOR APPARATUS WITH INNER WAFER CARRIER BUFFER AND METHOD

BACKGROUND

In semiconductor technologies, a semiconductor wafer is processed through various fabrication steps to form integrated circuits defined in multiple chips. Those fabrication steps include lithography patterning, etching, ion implantation, deposition, oxidation and thermal annealing. For example, a thermal oxidation process may be applied to a wafer to form an oxidation layer, such as a silicon oxide layer. In advanced technologies, a furnace tool includes a place to hold a wafer carrier and another place for nitrogen purge before the oxidation. However, the charge process to send wafers to the oxidation boat has quality issues due to Q time concern. Particularly, the nitrogen purge is implemented before wafer charge in the loading area. The wafer charge process is prolonged and the throughput is decreased.

What is needed is a processing apparatus and method to address the above concerns.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to bonding systems and a method of utilizing such systems for wafer bonding. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
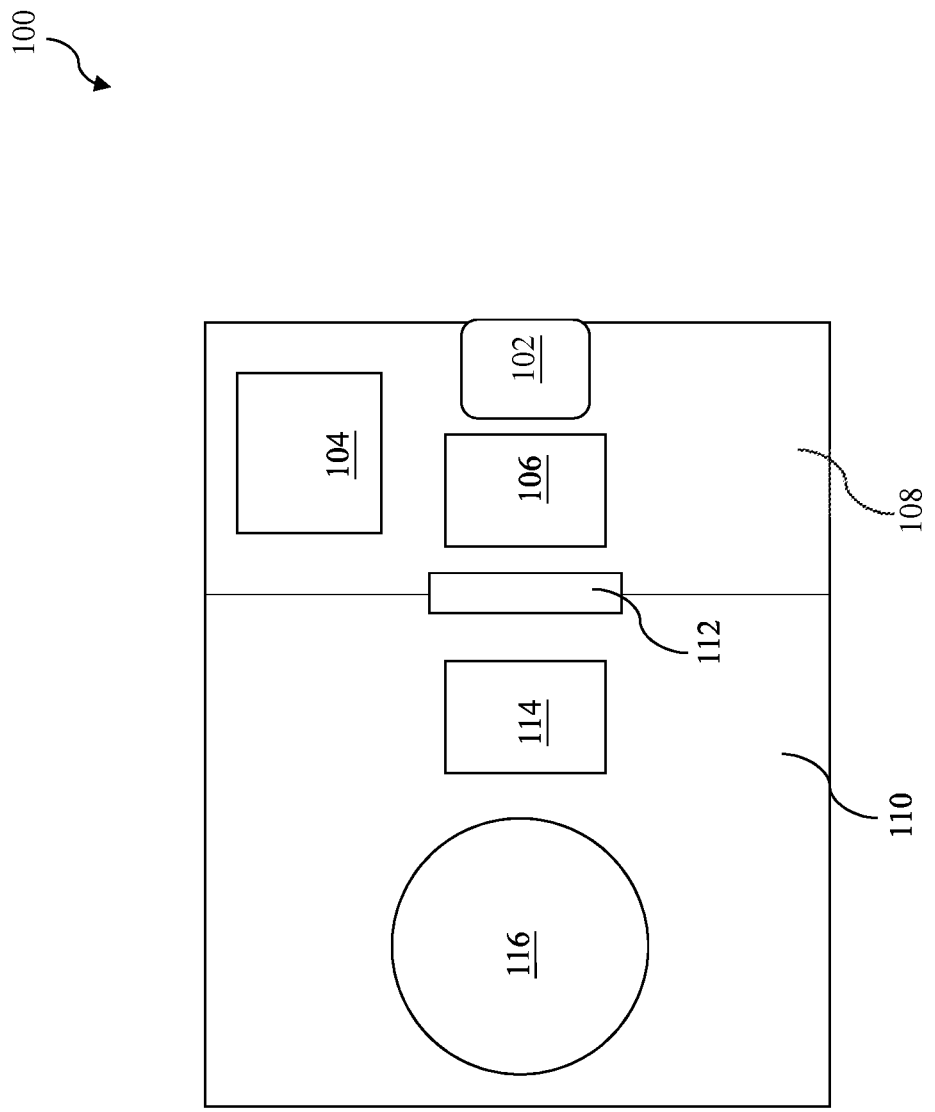
FIG. 1 is a schematic diagram of an embodiment of a processing apparatus integrated with an inner wafer carrier buffer constructed according to aspects of the present disclosure.
Figure 2:
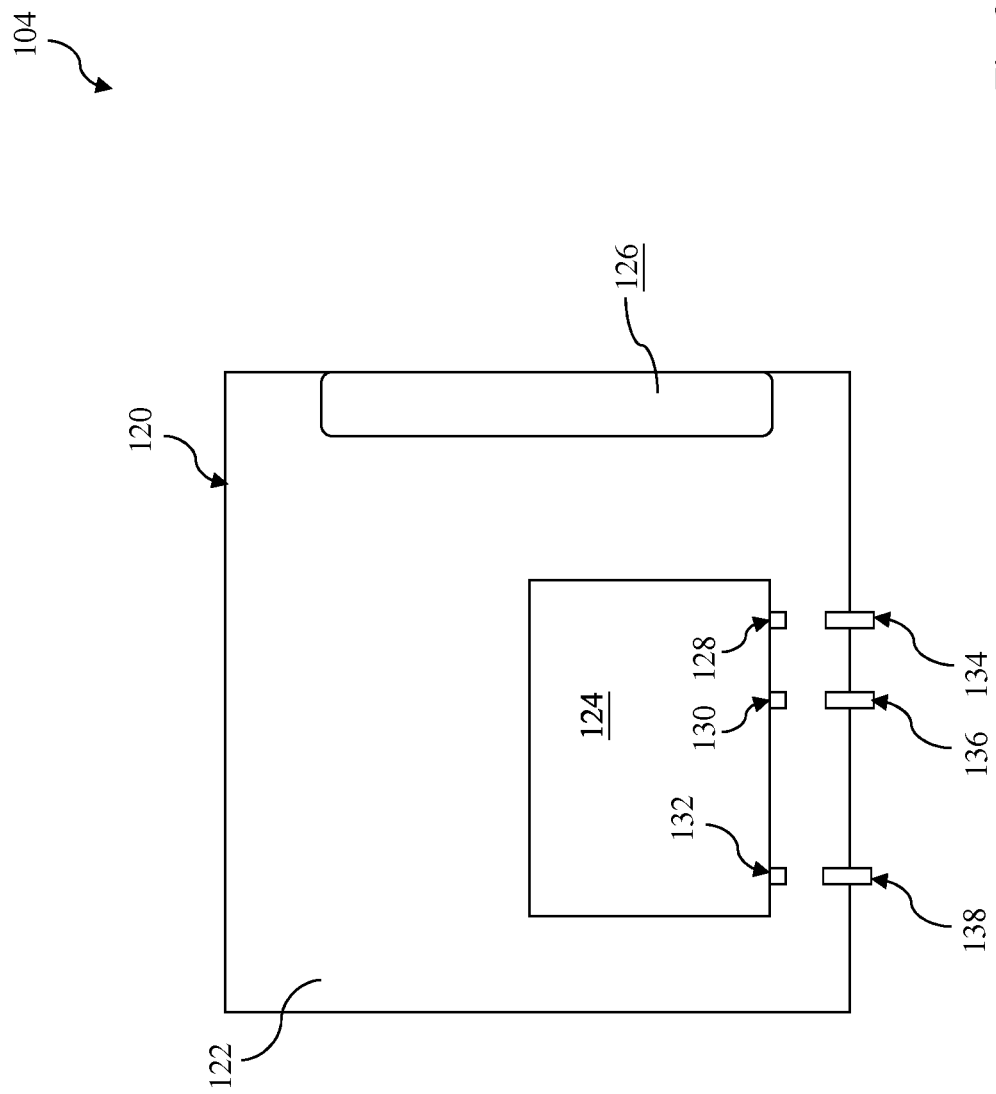
FIG. 2 is a schematic diagram of an embodiment of the inner wafer carrier buffer of FIG. 1 constructed according to aspects of the present disclosure.

Referring to FIG. 1, illustrated is a schematic top view of a processing apparatus 100 integrated with an inner wafer carrier buffer constructed according to aspects of the present disclosure in one embodiment. FIG. 2 is a schematic diagram of an embodiment of the inner wafer carrier buffer of the processing apparatus constructed according to aspects of the present disclosure. The processing apparatus 100 is configured and designed to perform a semiconductor fabrication process (or semiconductor process). In the present embodiment, the processing apparatus 100 is designed for thermal oxidation. In another embodiment, the processing apparatus 100 is designed for thermal annealing. Alternatively or additionally, the processing apparatus 100 may be designed for other process, such as lithography patterning, etching, ion implantation or deposition.

The processing apparatus 100 includes a load lock 102 designed as an apparatus gate to receive a wafer carrier that is able to carry a plurality of wafers. In the present embodiment, the wafer carrier is a front opening unified pod (FOUP). In furtherance of embodiment, the wafers to be contained in the wafer carrier are 300 mm semiconductor wafers or 450 mm semiconductor wafers. In one particular example, the processing apparatus 100 includes two load locks 102 to load wafer carriers in parallel.

The processing apparatus 100 includes an inner wafer carrier buffer (IWCB) 104 designed to hold one or more wafer carriers. In one example, the inner wafer carrier buffer 104 is designed to hold 8 to 10 FOUPs. The inner wafer carrier buffer 104 functions as an inner buffer to store wafer carrier(s) before the fabrication process. A wafer carrier is transferred from the load lock 102 to the inner wafer carrier buffer 104 by an outer transfer unit 106. The outer transfer unit 106 includes a mechanism to secure the wafer carrier and transfer the wafer carrier, such as transferring the wafer carrier between the load lock 102 and the inner wafer carrier buffer 104. In the present example, the outer transfer unit 106 includes a first robot that is operable to hold and move the wafer carrier.

Furthermore, the inner wafer carrier buffer 104 is operable to perform a nitrogen purge process to the wafers in the wafer carrier held therein. The inner wafer carrier buffer 104 is further described with reference to FIG. 2. The inner wafer carrier buffer 104 includes various wall features 120 defining a storage space 122 for holding one or more wafer carriers 124, such as FOUPs. The inner wafer carrier buffer 104 also includes a door 126 that is operable to open and close. The wafer carrier 124 is transferred in to or out from the inner wafer carrier buffer 104 through the door 126.

The wafer carrier (e.g., FOUP) 124 includes various gas ports, such as 128, 130 and 132. In the present embodiment, the gas port 128 is designed as a gas path for providing nitrogen gas to the wafer carrier 124, and the gas port 130 is designed as a gas path for exhausting the nitrogen gas from the wafer carrier 124. In another embodiment, the gas port 132 is designed as a gas path for adjusting the pressure of the wafer carrier 124.

The inner wafer carrier buffer 104 includes various gas transportation mechanisms configured to be connectable to respective gas ports of the wafer carrier 124 (such as gas ports 128, 130 and 132) and designed being operable to perform nitrogen purge to the wafer carrier 124. When the wafer carrier 124 is transferred to the inner wafer carrier buffer 104, it is be positioned such that the various gas transportation mechanisms are coupled with the respective gas ports of the wafer carrier 124. In the present embodiment, the inner wafer carrier buffer 104 includes a gas inlet 134 configured to be connectable to the gas port 128 of the wafer carrier 124. The inner wafer carrier buffer 104 includes a gas outlet 136 configured to be connectable to the gas port 130 of the wafer carrier 124. In furtherance of the present embodiment, the gas inlet 134 is further coupled to a nitrogen source such that the nitrogen gas can be transported to the wafer carrier 124 through the gas inlet 134 of the inner wafer carrier buffer 124 and the gas port 128 of the wafer carrier 124. The gas outlet 136 is further coupled to an exhaust mechanism such that the nitrogen gas can be transported out from the wafer carrier 124 through the gas outlet 136 of the inner wafer carrier buffer 124 and the gas port 130 of the wafer carrier 124. In one embodiment, the gas port 134 includes a valve being controlled for on and off. Similarly, the gas port 136 includes another valve being controlled for on and off.

The inner wafer carrier buffer 104 further includes a pressurization device 138 configured to be connectable to the gas port 132 of the wafer carrier 124. The pressurization device 138 is designed to be operable to adjust the pressure of the wafer carrier. In the present embodiment, the pressurization device 138 includes a valve being controlled for on and off and includes a sensor to monitor the pressure of the wafer carrier 124. In one embodiment where the inner wafer carrier buffer 104 is designed to hold multiple wafer carriers, the inner wafer carrier buffer 104 includes multiple sets of gas transportation mechanisms configured to be connectable to respective wafer carriers.

Referring back to FIG. 1, the processing apparatus 100 includes the inner wafer carrier buffer 104 and the outer transfer unit 106 configured in an enclosed region 108, which is also referred to as buffer module 108. The processing apparatus 100 includes another enclosed region 110 for a fabrication process (such as thermal oxidation or other suitable process), which is also referred to as loading area module 110. The loading area module 110 is adjacent the buffer module 108 and is integrated with the buffer module. Particularly, the loading area module 110 is coupled with the buffer module 108 through a door mechanism (or door) 112 for wafer transferring.

The loading area module 110 includes an inner transfer unit 114 to transfer wafers. The inner transfer unit 114 includes a mechanism to secure and transfer a wafer. In the present example, the inner transfer unit 114 includes a second robot that is operable to hold and move a wafer. When the wafer carrier 124 is transferred to the door 112 from the inner wafer carrier buffer 104 by an outer transfer unit 106, the inner transfer unit 114 transfers wafers from the wafer carrier 124 at the door 112 to the loading area module 110 or transfers the wafers from the loading area module 110 to the wafer carrier 124 at the door 112.

The loading area module 110 includes a processing module 116 to hold wafer(s) and to perform the fabrication process (such as thermal oxidation) to the wafer(s). The processing module 116 may be designed to perform a batch process to a plurality of wafers. In the present embodiment, the processing module 116 is designed to perform a thermal oxidation process to a batch of wafers. In one example, a batch includes a number of wafers ranging between about 50 and about 100 wafers.

The processing module 116 includes a mechanism, such as a wafer boat, to hold one or more wafers. For example, the wafer boat is designed to hold a batch of wafers having about 50 to 100 wafers. In the present embodiment, the processing module 116 includes a mechanism for thermal oxidation. In furtherance of the embodiment, the processing module 116 includes a heating source and oxygen source configured to perform the thermal oxidation. In other embodiment, the processing module 116 may include other proper component, such as a thermal sensor to monitor temperature and may further include a control mechanism to control the thermal oxidation temperature using a proper control mode, such as feedback.

When the wafer carrier 124 and the wafers therein are nitrogen purged at the inner wafer carrier buffer 104, the wafer carrier 124 is transferred to the door 112 by the outer transfer unit 106. The inner transfer unit 114 is used to transfer wafers from the wafer carrier 124 at the door 112 to the processing module 116 (such as the wafer boat) through the door 112. This procedure may be repeated to other wafer carriers in the inner wafer carrier buffer 104 such that the wafers reach the capacity of the processing module 116 for the fabrication process. This procedure is referred to as wafer charge. Since the nitrogen purge is implemented in the inner wafer carrier buffer 104, the wafer charge time is substantially reduced. Thereafter, the fabrication process is applied to the wafers charged in the processing module 116. The fabrication efficiency is substantially increased since the idle time of the processing module 116 is reduced or minimized. The wafers in the processing module 116 are discharged after the respective fabrication process is completed.

Figure 3:
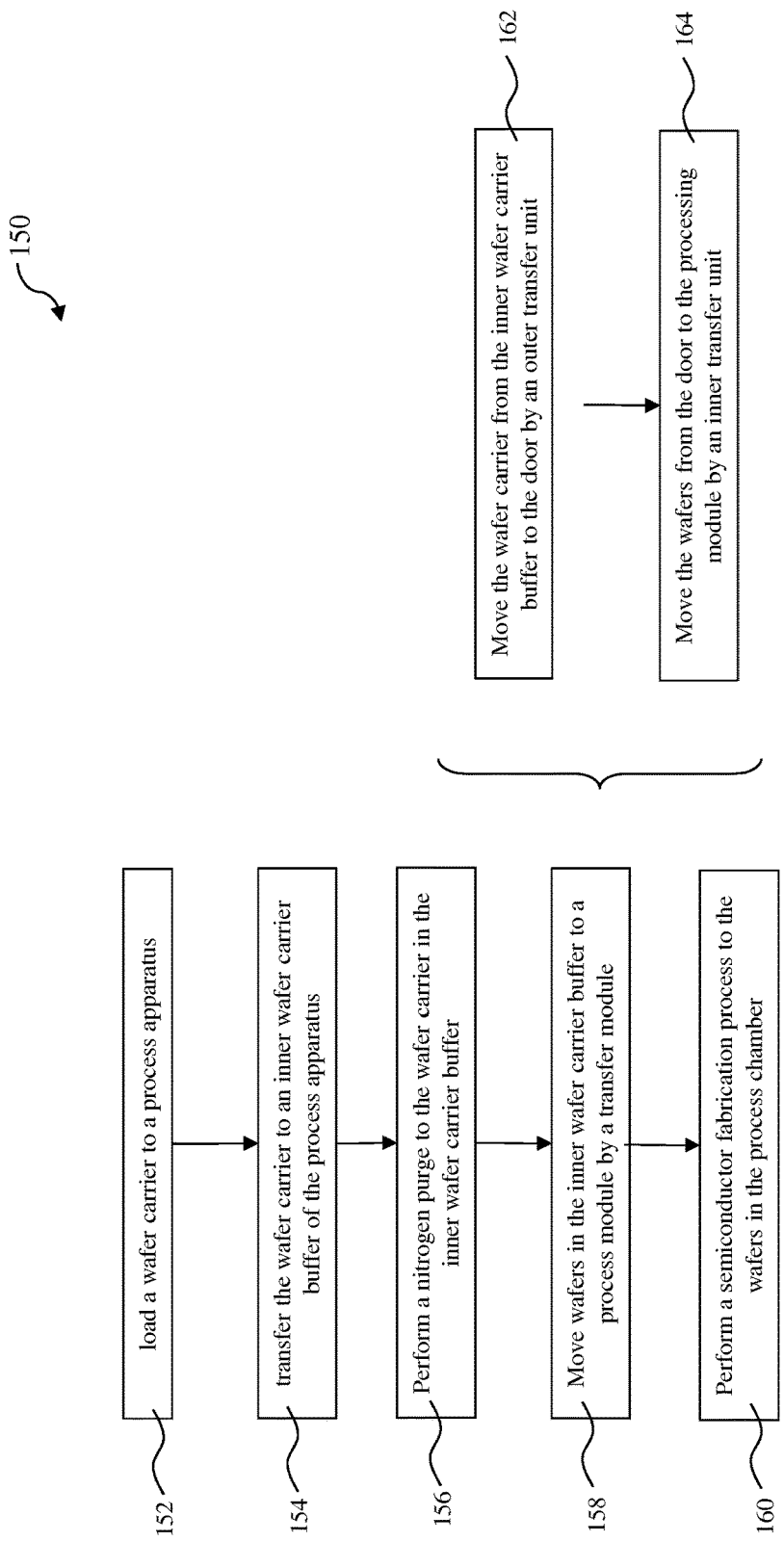
FIG. 3 is a flowchart of one embodiment of a method utilizing the processing apparatus of FIG. 1 constructed according to aspects of the present disclosure.

FIG. 3 is a flowchart of a method 150 to perform a fabrication process (such as thermal oxidation) constructed according to aspects of the present disclosure in one or more embodiment. The method 150 is implemented in the processing apparatus 110 in the present embodiment. The method 150 is described with reference to FIGS. 1 to 3. The method includes an operation 152 by loading a wafer carrier 124 to the processing apparatus 100 through the load lock 102. In one embodiment, two or more wafer carriers are loaded into the processing apparatus 100. In another embodiment, the processing apparatus 100 includes two or more load locks 102 to load the multiple wafer carriers.

The method 150 also includes an operation 154 by transferring the wafer carrier 124 from the load lock 102 to the inner wafer carrier buffer 104 by the outer transfer unit 106. When the wafer carrier 124 is transferred to the inner wafer carrier buffer 104, the wafer carrier is positioned such that its gas ports are connected to the respective gas transportation mechanisms of the inner wafer carrier buffer 104. In one embodiment, the multiple wafer carriers are transferred to the inner wafer carrier buffer 104 by the outer transfer unit 106 in a proper mode, such as one carrier by one carrier.

The method 150 also includes an operation 156 by performing a nitrogen purge to the wafer carrier(s) 124 in the inner wafer carrier buffer 104. The nitrogen purge is implemented by controlling the gas transportation mechanisms (such as the gas inlet 134 and the gas outlet 136) of the inner wafer(s) carrier buffer 104. In one embodiment, the pressurization device 138 is further controlled to adjust the pressure of the wafer carrier(s) 124 for a proper carrier pressure during the storage and/or the nitrogen purge of the wafer carrier(s) 124.

The method 150 also includes an operation 158 by moving the wafers in the inner wafer carrier buffer 104 to the processing module 116 using a transfer module. The wafer transfer is implemented after the nitrogen purge. In the present embodiment, the transfer module includes an outer transfer unit 106 for wafer carrier transferring and the inner transfer unit 114 for wafer transferring. In furtherance of the embodiment, the operation 158 includes two steps for wafer carrier transferring and wafer transferring, respectively. Particularly, the operation 158 includes a first step 162 for wafer carrier transferring. At step 162, the outer transfer unit 106 is employed to transfer the wafer carrier 124 to the door 112. The operation 158 includes a second step 164 for wafer transferring after the first step. At step 164, the inner transfer unit 114 is used to transfer wafers from the wafer carrier 124 at the door 112 to the processing module 116 (such as the wafer boat) through the door 112. Afterward, the empty wafer carrier 124 at the door 112 is moved back to the inner wafer carrier buffer 104 by the outer transfer unit 106. This procedure may be repeated to other wafer carriers in the inner wafer carrier buffer 104. The thus transferred wafers may reach the maximum capacity of the processing module 116 for the fabrication process. As noted, this procedure is referred to as wafer charge. Since the nitrogen purge is implemented in the inner wafer carrier buffer 104, the wafer charge time is substantially reduced. The stay time of the wafer carrier 124 at the door 112 is reduced to the time enough to transfer the wafers in the wafer carrier to the processing module 116.

Thereafter, the method 150 includes an operation 160 by perform a semiconductor fabrication process (or semiconductor process) to the wafers in the processing module 116. In the present example, the semiconductor process includes thermal oxidation. It is a batch process applied to the wafers in the processing module 116. In this particular example, the wafers are positioned in a wafer boat designed to hold a plurality of wafers. In one example, the batch of wafers in the wafer boat includes about 50 to 100 wafers. In other examples, the semiconductor process may include thermal annealing or other suitable process, such as other suitable batch process. The fabrication efficiency is substantially increased since the idle time of the processing module 116 is reduced or minimized.

Other operations may be implemented before, during or after the method 150. In one embodiment, the wafers in the processing module 116 are discharged after the respective fabrication process at the operation 160 is completed. In furtherance of the embodiment, the discharge may include transferring the wafers from the processing module 116 to the wafer carrier at the door 112 by the inner transfer unit 116 and thereafter transferring the wafer carrier from the door 112 to the inner wafer carrier buffer 104 by the outer transfer unit 106. In another embodiment, the wafer carrier may be directly sent out of the processing apparatus 100 through the load lock 102. In another alternative embodiment, after the all wafers in the processing module 116 are transferred to the inner wafer carrier buffer 104 with respective wafer carriers, those wafer carriers are then transferred out of the processing apparatus 100 through the load lock 102.

Figure 4:
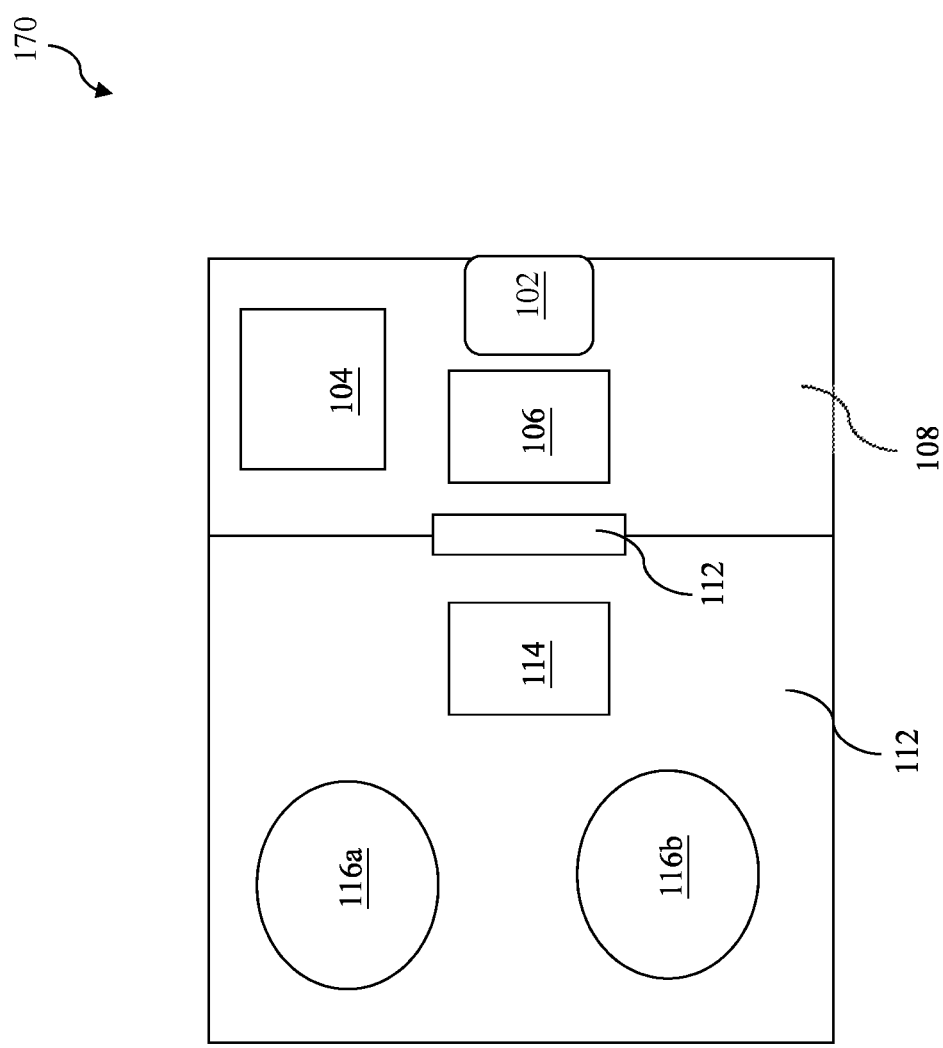
FIG. 4 is a schematic diagram of another embodiment of a processing apparatus integrated with an inner wafer carrier constructed according to aspects of the present disclosure.

FIG. 4 illustrates a schematic top view of a processing apparatus 170 constructed according to aspects of the present disclosure in another embodiment. The method 150 may be implemented in the processing apparatus 170 according to one embodiment. The processing apparatus 170 is similar to the processing apparatus 100. However, in the processing apparatus 170, the loading area module 110 includes two or more processing modules, such as processing modules 116*a* and 116*b* for example. The multiple processing modules are configured in the loading area module 112. Accordingly, the wafer charge process is implemented such that wafers are transferred to the multiple processing modules. In another example of the wafer charge process, the wafers may be alternatively transferred to a first processing module for a first fabrication process. Then the wafers are transferred from the first processing module to a second processing module for a second fabrication process.

Figure 5:
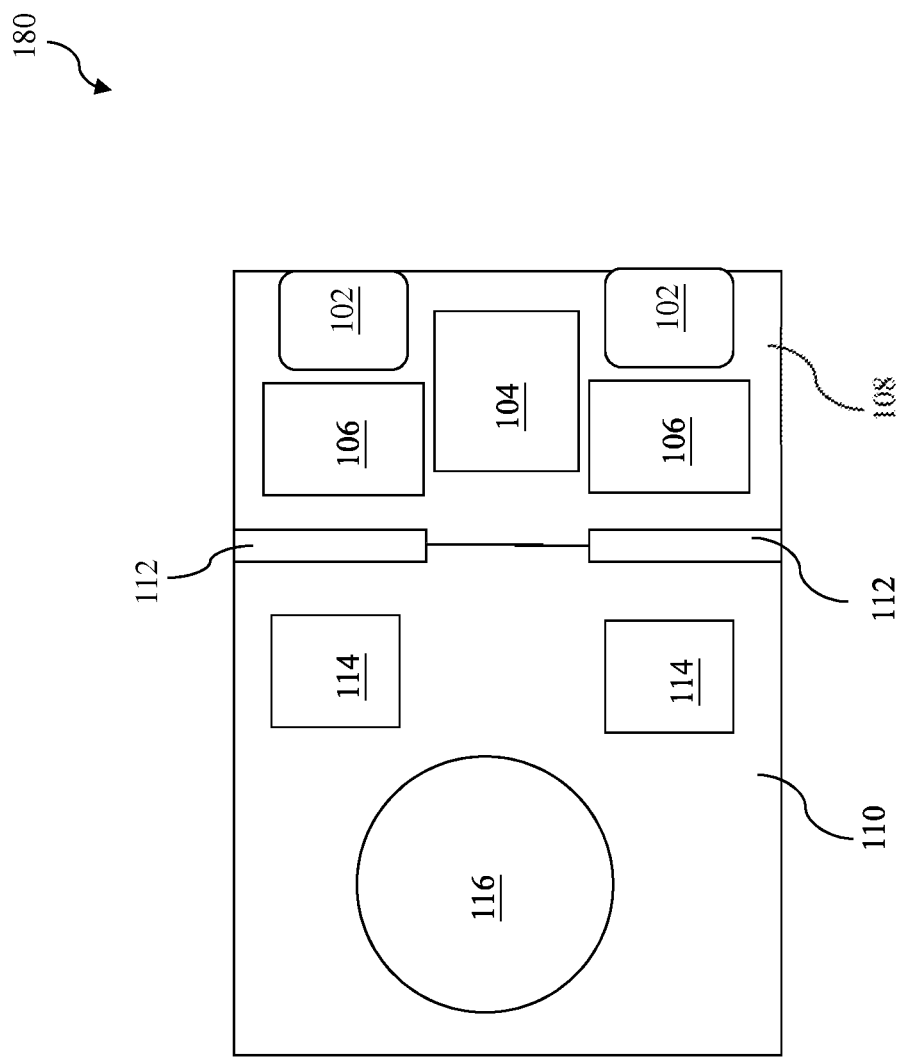
FIG. 5 is a schematic diagram of another embodiment of a processing apparatus integrated with an inner wafer carrier constructed according to aspects of the present disclosure.

FIG. 5 illustrates a schematic top view of a processing apparatus 180 constructed according to aspects of the present disclosure in another embodiment. The method 150 may be implemented in the processing apparatus 180 according to one embodiment. The processing apparatus 180 is similar to the processing apparatus 100. For example, the processing apparatus 180 includes the loading area module 110 that further includes an inner transfer unit 114 and a processing module 116. Particularly, the processing apparatus 180 includes an inner wafer carrier buffer 104 designed and configured to hold one or more wafer carriers and to perform a nitrogen purge to the wafer carrier(s) therein. However, in the processing apparatus 180, the buffer module 108 includes two or more load locks 102, two or more outer transfer units 106 properly configured for parallel wafer carrier transferring with reduced loading time according one embodiment. In another embodiment, the two or more doors 112 are incorporated in the processing apparatus 180 with proper configuration so to provide multiple paths for wafer transferring to the processing module 116. For example, one load lock 102 and one outer transfer unit 106 are paired up to transfer wafer carriers into the inner wafer carrier buffer 104. Similarly, another load lock 102 and another outer transfer unit 106 are paired up to transfer wafer carriers into the inner wafer carrier buffer 104. In another example, one door 112 and one inner transfer unit 114 are paired up to transfer wafers from a wafer carrier at the respective door 112 to the processing module 116. Similarly, another door 112 and another inner transfer unit 114 are paired up to transfer wafers from a wafer carrier at the respective door 112 to the processing module 116.

Figure 6:
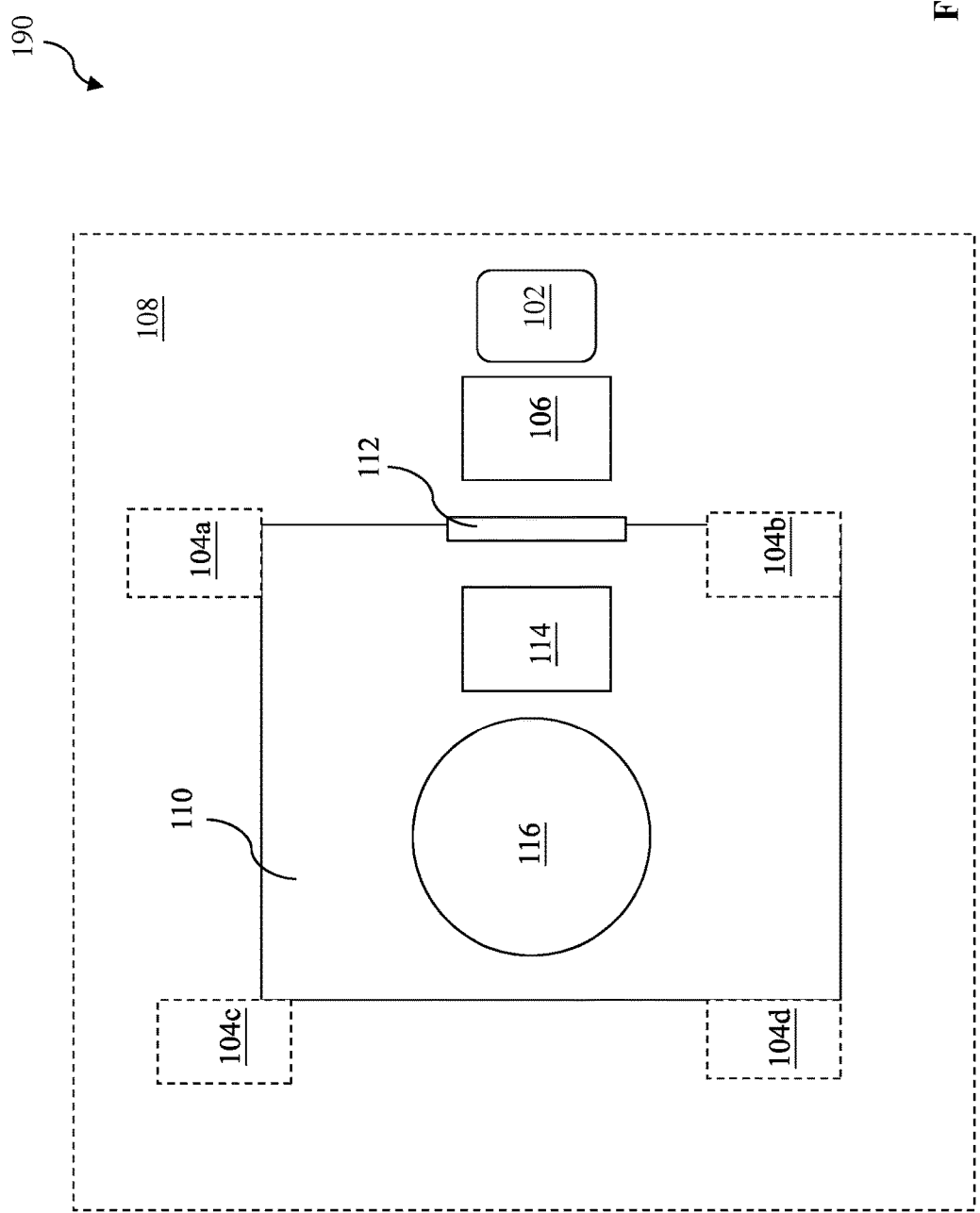
FIG. 6 is a schematic diagram of a processing apparatus integrated with an inner wafer carrier constructed according to aspects of the present disclosure in other embodiments.

FIG. 6 illustrates a schematic sectional view of a processing apparatus 190 constructed according to aspects of the present disclosure in other embodiments. The processing apparatus 190 is similar to the processing apparatus 100. For example, the processing apparatus 190 includes the buffer module 108 that further includes an outer transfer module 106 and an inner wafer carrier buffer 104. The processing apparatus 190 includes the loading area module 110 that further includes an inner transfer unit 114 and a processing module 116. However, in the processing apparatus 190, the inner wafer carrier buffer 104 may be configured differently but is operable to store one or more wafer carriers and to perform a nitrogen purge to the wafer carrier(s) therein. Various embodiments of the inner wafer carrier buffer 104 are illustrated as dashed rectangles in the same figure for simplicity.

In one embodiment, the inner wafer carrier buffer 104 is configured in a top portion of the processing apparatus 190, such as the 104*a* or 104*c*. In another embodiment, the inner wafer carrier buffer 104 is configured in a bottom portion of the processing apparatus 190, such as 104*b* and 104*d*. In yet another embodiment, the inner wafer carrier buffer 104 is configured in one side of the buffer module 108 (such as the 104*a* or 104*b*) or another side of the buffer module 108 (such as the 104*a* or 104*b*).

The method 150 of FIG. 3 is applicable to the processing apparatus 190 in various embodiments. The wafer transfer is implemented after the nitrogen purge. Particularly, the operation 158 includes a first step 162 for wafer carrier transferring. At step 162, the outer transfer unit 106 is employed to transfer the wafer carrier 124 to the door 112. The operation 158 includes a second step 164 for wafer transferring after the first step. At step 164, the inner transfer unit 114 is used to transfer wafers from the wafer carrier 124 at the door 112 to the processing module 116 (such as the wafer boat) through the door 112. Afterward, the empty wafer carrier 124 at the door 112 is moved back to the inner wafer carrier buffer 104 by the outer transfer unit 106.

The above described system (or apparatus) and method only serve as examples. The above system and method may be extended and modified and may include proper variations, embodiments, and alternatives without departure of the spirit of the invention. In one embodiment, in the method 150, another nitrogen purge may be implemented to the wafer carrier(s) 124 after the discharge. In another embodiment for the nitrogen purge, another gas purge or gas treatment may be alternatively or additionally applied to the wafer carrier(s) and wafers in the wafer carriers when stored in the inner wafer carrier buffer, such as inert gas purge. In one example, the inert gas purge includes argon purge. In another embodiment, a pressurization device is activated to adjust the pressure of the wafer carrier.

The present disclosure provides a processing apparatus integrated with an inner wafer carrier buffer designed for storing wafer carrier(s) and performing nitrogen purge to the wafer carrier(s). Other variations in this spirit and scope are considered as consistent with the present disclosure and are suggestive. For example, the processing apparatus 100 may be designed otherwise but the inner wafer carrier 104 is designed as a component of the processing apparatus for wafer carrier storage in the processing apparatus and is further designed to apply a nitrogen purge to the wafer carrier(s) in therein.

Thus, the present disclosure provides a semiconductor processing apparatus. The processing apparatus includes a load lock designed to receive a wafer carrier; an inner wafer carrier buffer configured to hold the wafer carrier received from the load lock and to perform a nitrogen purge to the wafer carrier; and a processing module designed to perform a semiconductor process to wafers from the wafer carrier.

In one embodiment of the processing apparatus, the inner wafer carrier buffer has a gas inlet and a gas outlet configured to be connectable to corresponding gas ports of the wafer carrier. In other embodiments, the gas inlet is coupled with a nitrogen source and the gas outlet is coupled with a gas exhaust; and the gas inlet and gas outlet each include a valve operable to control gas transportation.

In another embodiment, the inner wafer carrier buffer further includes a pressurization device configured to be connectable to the wafer carrier and designed to control pressure of the wafer carrier. In yet another embodiment, the pressurization device includes a pressure port for conducting gas; a pressure sensor to monitor the pressure of the wafer carrier; and a valve integrated in the pressure port and coupled with the pressure sensor.

In yet another embodiment, the wafer carrier is a front opening unified pod (FOUP). In yet another embodiment, the processing module includes a furnace designed for thermal oxidation.

In yet another embodiment, the processing apparatus further includes a transfer module designed to transfer the wafers from the inner wafer carrier buffer to the processing module. In yet another embodiment, the processing module includes a door configured between the outer transfer unit and the inner transfer unit. In yet another embodiment, the transfer module further includes an outer transfer unit for transferring the wafer carrier from the inner wafer carrier buffer to the door; and an inner transfer unit for transferring wafers in the wafer carrier at the door to the processing module.

The present disclosure also provides another embodiment of a semiconductor processing apparatus that includes a load lock designed to receive a wafer carrier; an inner wafer carrier buffer configured to hold the wafer carrier from the load lock, wherein the inner wafer carrier buffer has a gas inlet and a gas outlet configured to be connectable to corresponding gas ports of the wafer carrier for gas purge; a processing module designed to perform a semiconductor process to at least one wafer from the wafer carrier; and a transfer module configured to transfer the wafer from the wafer carrier in the inner wafer carrier buffer to the processing module.

In one embodiment of the processing apparatus, the wafer carrier is a front opening unified pod (FOUP); and the processing module includes a furnace designed for thermal oxidation. In another embodiment, the gas inlet is connected to a nitrogen source and the gas outlet is connected to a gas exhaust; and the gas inlet and gas outlet each include a valve operable to control gas transportation.

In yet another embodiment, the inner wafer carrier buffer further includes a pressurization device configured to be connectable to the wafer carrier and designed to control pressure of the wafer carrier.

In yet another embodiment, the transfer module further includes an outer transfer unit for transferring the wafer carrier and an inner transfer unit for transferring wafers in the wafer carrier.

The present disclosure also provides one embodiment of a method of a semiconductor process. The method includes receiving a wafer carrier from a load lock; sending the wafer carrier to an inner wafer carrier buffer; performing a nitrogen purge in the inner wafer carrier buffer; thereafter, transferring at least one wafer from the wafer carrier to the processing module; and performing a fabrication process to the at least one wafer in the process module.

In one embodiment of the method, the transferring at least one wafer from the wafer carrier to a processing module includes moving the wafer carrier out from the inner wafer carrier buffer using an outer transfer unit; and moving the at least one wafer from the wafer carrier out to the processing module using an inner transfer unit.

In another embodiment, the sending the wafer carrier to the inner wafer carrier buffer includes coupling a gas inlet and a gas outlet of the inner wafer carrier buffer to corresponding ports of the wafer carrier. In yet another embodiment, the performing a nitrogen purge includes turning on the gas inlet to provide a nitrogen gas to the wafer carrier.

In yet another embodiment, the sending the wafer carrier to the inner wafer carrier buffer further includes coupling a pressurization device of the inner wafer carrier buffer to a corresponding port of the wafer carrier.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus, comprising:
   a first load lock, wherein the first load lock includes an opening to receive a first wafer carrier directly from outside the apparatus;
   a second load lock, wherein the second load lock includes an opening to receive a second wafer carrier directly from outside the apparatus;
   an inner wafer carrier buffer interposing and separated from the first load lock and the second load lock, wherein the inner wafer carrier buffer is configured to hold the first wafer carrier transferred from the first load lock and the second wafer carrier transferred from the second load lock, wherein the inner wafer carrier buffer includes a door for passing through the first and the second wafer carriers, and wherein the inner wafer carrier buffer is configured to perform a nitrogen purge to the first and the second wafer carriers, each of the first and the second wafer carriers including multiple wafers;

a processing module designed to perform thermal oxidation to wafers transferred from the first wafer carrier and the second wafer carrier; and a transfer module including at least one outer transfer unit configured to transfer one of the first and the second wafer carriers into and out of the inner wafer carrier buffer through the door disposed on the inner wafer carrier buffer, and at least one inner transfer unit configured to transfer a wafer from one of the first and the second wafer carriers to the processing module, wherein the at least one inner transfer unit is disposed outside of and physically separated from the inner wafer carrier buffer.

2. The apparatus of claim 1, wherein the inner wafer carrier buffer has at least one gas inlet and at least one gas outlet configured to be connectable to corresponding gas ports of the first and the second wafer carriers.

3. The apparatus of claim 2, wherein the at least one gas inlet is coupled with a nitrogen source and the at least one gas outlet is coupled with a gas exhaust.

4. The apparatus of claim 1, wherein the inner wafer carrier buffer further includes a pressurization device configured to be connectable to and to control pressure of the first and the second wafer carriers, wherein the pressurization device includes a pressure port for conducting gas and a pressure sensor to monitor the pressure of the first and the second wafer carriers.

5. The apparatus of claim 4, wherein the pressurization device further includes a valve integrated in the pressure port and coupled with the pressure sensor.

6. The apparatus of claim 1, wherein the first wafer carrier is a front opening unified pod (FOUP).

7. The apparatus of claim 1, wherein the processing module includes a furnace and an oxygen source.

8. The apparatus of claim 1, wherein the transfer module includes a first outer transfer unit, a second outer transfer unit, a first inner transfer unit, and a second inner transfer unit.

9. The apparatus of claim 8, wherein the processing module further includes a first door configured between the first outer transfer unit and the first inner transfer unit of the transfer module and a second door configured between the second outer transfer unit and the second inner transfer unit of the transfer module.

10. The apparatus of claim 9, wherein the first outer transfer unit is configured to transfer the first wafer carrier from the inner wafer carrier buffer to the first door, wherein the first inner transfer unit is configured to transfer wafers in the first wafer carrier at the first door to the processing module, wherein the second outer transfer unit is configured to transfer the second wafer carrier from the inner wafer carrier buffer to the second door, and wherein the second inner transfer unit is configured to transfer wafers in the second wafer carrier at the second door to the processing module.

11. An apparatus, comprising:

a first enclosed region, wherein the first enclosed region includes:
a load lock including an apparatus gate having an opening designed to receive a wafer carrier directly from outside the apparatus, wherein the wafer carrier includes multiple wafers,
at least one inner wafer carrier buffer, the at least one inner wafer carrier buffer including walls defining a storage space configured to receive the wafer carrier transferred from the load lock, wherein the at least one inner wafer carrier buffer includes a gas transportation system configured to connect with the wafer carrier, the gas transportation system including a gas inlet, a gas outlet, and a pressurization device each connectable to a corresponding gas port of the wafer carrier, wherein the pressurization device is configured to adjust pressure within the wafer carrier, and wherein each of the walls of the at least one inner wafer carrier buffer is disposed a distance away from a boundary of the first enclosed region;
at least one outer transfer unit disposed adjacent to the load lock and configured to transfer the wafer carrier from the load lock to the at least one inner wafer carrier buffer; and
a second enclosed region adjacent to the first enclosed region, wherein the second enclosed region includes a processing module designed to perform thermal oxidation to at least one wafer from the wafer carrier and at least one inner transfer unit configured to transfer wafers from the wafer carrier to the processing module, wherein the at least one inner transfer unit is disposed outside of and physically separated from the at least one inner water carrier buffer.

12. The apparatus of claim 11, wherein the wafer carrier is a front opening unified pod (FOUP), and the processing module includes a furnace and an oxygen source designed for thermal oxidation.

13. The apparatus of claim 11, wherein the gas inlet is connected to a nitrogen source and the gas outlet is connected to a gas exhaust, and the gas inlet and gas outlet includes a valve operable to control gas transportation.

14. The apparatus of claim 11, wherein the inner transfer unit is configured to transfer one wafer at a time from the wafer carrier to the processing module.

15. The apparatus of claim 11, wherein the at least one outer transfer unit and the at least one inner transfer unit each includes a robot.

16. An apparatus, comprising:
a first load lock designed to receive a first wafer carrier, wherein the first load lock includes an opening to receive the first wafer carrier directly from outside the apparatus;
a second load lock designed to receive a second wafer carrier, wherein at least one of the first and the second wafer carriers is a front opening unified pod (FOUP) configured to hold multiple wafers and wherein the second load lock includes an opening to receive the second wafer carrier directly from outside the apparatus;
an inner wafer carrier buffer designed to receive both the first wafer carrier and the second wafer carrier from their respective load locks through a door configured on a wall of the inner wafer carrier buffer;
a nitrogen purge device connected to the inner wafer carrier buffer, wherein the nitrogen purge device includes a gas inlet and a gas outlet configured to convey nitrogen into and out of the inner wafer carrier buffer, respectively;

a processing module configured to perform a fabrication process to multiple wafers, wherein the processing module includes a furnace and an oxygen source;

an outer transfer unit configured to transfer at least one of the first and the second wafer carriers from their respective load locks to the inner wafer carrier buffer; and an inner transfer unit configured to transfer at least one wafer from at least one of the first and second wafer carriers to the processing module, wherein the inner transfer unit is disposed outside of and physically separated from the inner wafer carrier buffer.

17. The apparatus of claim 16, wherein the outer transfer unit is configured to move at least one of the first and the second wafer carriers out from the inner wafer carrier buffer to a door disposed between the outer transfer unit and the inner transfer unit, and wherein the inner transfer unit is configured to move at least one wafer from at least one of the first and second wafer carriers at the door to the processing module.

18. The apparatus of claim 16, further comprising a pressure sensor.

19. The apparatus of claim 16, wherein the gas inlet is coupled to a nitrogen source and the gas outlet is coupled to an exhaust.

20. The apparatus of claim 16, further comprising:
a pressurization device coupled to a corresponding port of at least one of the first and second wafer carriers.

* * * * *